US010359173B2

(12) United States Patent
Chun

(10) Patent No.: US 10,359,173 B2
(45) Date of Patent: Jul. 23, 2019

(54) SOLAR ORIGAMI-LIKE PORTABLE LIGHT ASSEMBLY AND DEVICE CHARGER

(71) Applicant: Alice M. Chun, New York, NY (US)

(72) Inventor: Alice M. Chun, New York, NY (US)

( * ) Notice: Subject to any disclaimer, the term of this patent is extended or adjusted under 35 U.S.C. 154(b) by 0 days.

(21) Appl. No.: 16/112,754

(22) Filed: Aug. 26, 2018

(65) Prior Publication Data

US 2019/0063721 A1    Feb. 28, 2019

Related U.S. Application Data

(60) Provisional application No. 62/551,286, filed on Aug. 29, 2017.

(51) Int. Cl.
| F21L 4/02 | (2006.01) |
| F21L 4/08 | (2006.01) |
| F21S 8/04 | (2006.01) |
| F21S 9/03 | (2006.01) |
| F21V 1/00 | (2006.01) |
| F21V 1/14 | (2006.01) |
| F21V 3/02 | (2006.01) |
| F21V 23/04 | (2006.01) |
| F21V 23/06 | (2006.01) |

(Continued)

(52) U.S. Cl.
CPC ............... *F21V 3/02* (2013.01); *F21L 4/027* (2013.01); *F21L 4/08* (2013.01); *F21S 8/04* (2013.01); *F21S 9/037* (2013.01); *F21V 1/00* (2013.01); *F21V 21/26* (2013.01); *F21V 21/40* (2013.01); *F21V 23/0407* (2013.01); *F21V 23/06* (2013.01); *H05K 1/142* (2013.01); *F21V 1/14* (2013.01); *F21V 31/005* (2013.01); *F21Y 2105/12* (2016.08); *F21Y 2105/18* (2016.08); *F21Y 2115/10* (2016.08); *H05K 2201/10037* (2013.01); *H05K 2201/10106* (2013.01); *H05K 2201/10121* (2013.01); *H05K 2201/10522* (2013.01); *H05K 2201/2054* (2013.01)

(58) Field of Classification Search
CPC ........... F21L 4/00–085; F21S 9/03–037; F21S 8/06–068; F21V 1/00–26; F21V 3/02–026; F21V 3/06–0625; F21V 9/083
See application file for complete search history.

(56) References Cited

U.S. PATENT DOCUMENTS

| 7,825,325 | B2 * | 11/2010 | Kennedy | .................. F21L 4/00 |
| | | | | 362/249.04 |
| D727,555 | S * | 4/2015 | Gunawan | ...................... D26/94 |

(Continued)

FOREIGN PATENT DOCUMENTS

| CN | 201187126 Y | * | 1/2009 | ............. E04F 10/04 |
| CN | 102518953 A | * | 6/2012 | |

(Continued)

Primary Examiner — Mariceli Santiago
(74) Attorney, Agent, or Firm — Brenda Pomerance

(57) ABSTRACT

A portable lamp powered by a battery charged by solar panel or by wall-outlet power, opens from (a) a flat book-like configuration with a collapsed light diffuser to (b) an open book-like configuration with a half-dome origami-like light diffuser to (c) a book opened so the outsides of the covers are back-to-back forming a 24-faced altered-cube-shape light diffuser. The spine of the "book" has ports for receiving wall outlet power and for charging an external device.

13 Claims, 9 Drawing Sheets

(51) Int. Cl.
  *H05K 1/14*     (2006.01)
  *F21V 21/26*    (2006.01)
  *F21V 21/40*    (2006.01)
  *F21V 31/00*    (2006.01)
  *F21Y 105/12*   (2016.01)
  *F21Y 105/18*   (2016.01)
  *F21Y 115/10*   (2016.01)

(56) References Cited

U.S. PATENT DOCUMENTS 9,200,770 B2 * 12/2015 Chun ..................... F21S 8/00
D756,555 S * 5/2016 Gunawan ..................... D26/94
2018/0128438 A1 * 5/2018 Sreshta ................... F21S 9/037

FOREIGN PATENT DOCUMENTS

| CN | 202660258 U | * | 1/2013 |
| CN | 104633478 A | * | 5/2015 |
| CN | 204534157 U | * | 8/2015 |
| CN | 205480378 U | * | 8/2016 |
| CN | 205807279 U | * | 12/2016 |

* cited by examiner

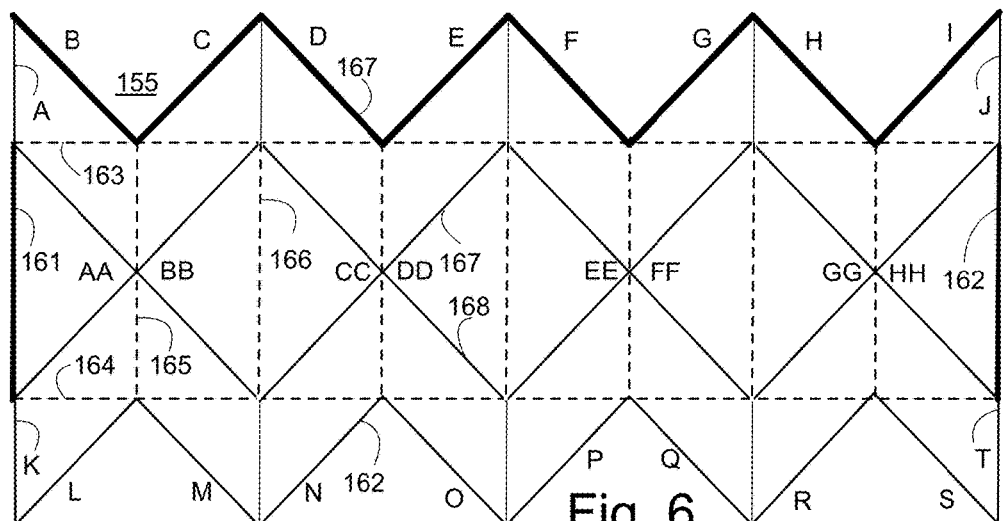
Fig. 6
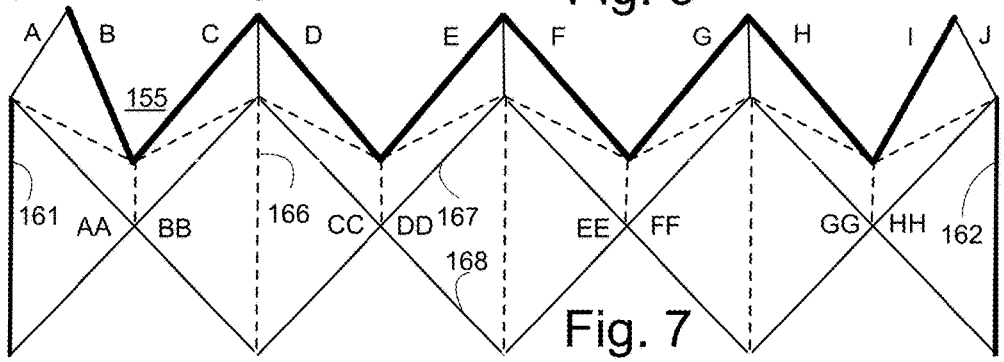
Fig. 7
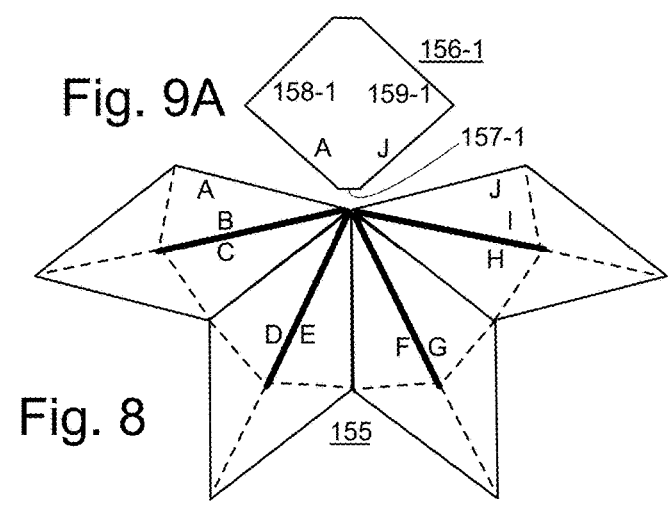
Fig. 9A
Fig. 8
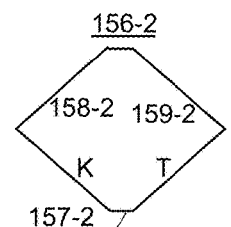
Fig. 9B

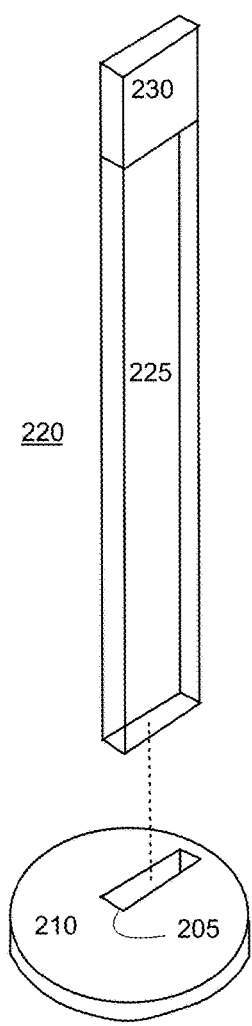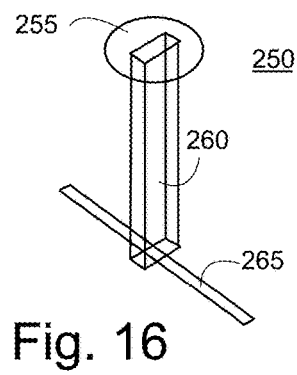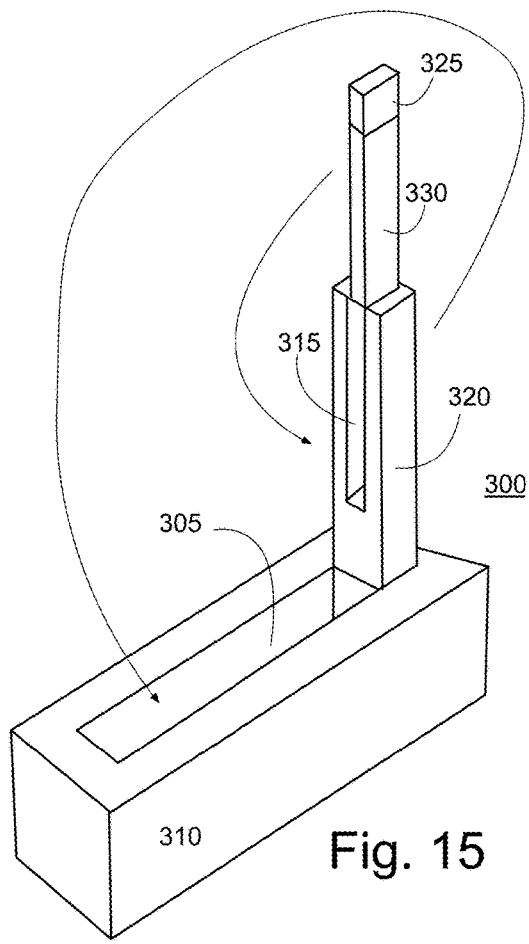
Fig. 14
Fig. 16
Fig. 15

SOLAR ORIGAMI-LIKE PORTABLE LIGHT ASSEMBLY AND DEVICE CHARGER

CROSS-REFERENCE TO RELATED APPLICATIONS

This application claims priority from U.S. provisional patent application Ser. No. 62/551,286, filed Aug. 29, 2017, having a common inventor herewith.

BACKGROUND OF THE INVENTION

The present invention is a portable lamp and device charger powered by a battery that is charged from the power output by solar panels or from wall-outlet power, and more particularly, is directed to a lamp that opens from (a) a flat book to (b) an open book with a half-dome origami-like diffuser to (c) a book opened so the outsides of the covers are back-to-back forming a cube-shaped diffuser. The spine of the "book" has ports for receiving wall outlet power and for charging an external device.

Off-grid solar power and light innovation is used in regions without infrastructure and electricity. In regions with electricity many people need power on the go charging for phones or electronic devices during travel, camping, and outdoor activities. Current solar-charged lamp/light solutions and powerbanks are expensive and difficult to transport which make them costly to deploy in large numbers.

Acid cell battery or fuel-powered lighting solutions have the obvious disadvantage of recurring cost and limited resources. Many renewable lighting solutions require expensive components and are large and difficult to ship.

A portable lamp with USB device charger is disclosed in U.S. Patent Application Publication Serial No. 2018/0128438, and is shown in FIGS. 1A-1B. This lamp has a battery that can be charged via the solar panel or via its USB port. This lamp is inflatable and has a. reclosable nozzle permitting air to flow to and from the center of the lamp, but germs can be transferred via the nozzle.

SUMMARY OF THE INVENTION

In accordance with an aspect of this present invention, there is provided a portable lamp, comprising two circuit boards, each circuit board having an outside and an inside, each outside having at least one solar panel, each inside having (a) at least two light emitting diodes (LEDs), (b) a rechargeable battery, and (c) a circuit connecting the solar panel, the battery, and the LEDs; a transparent sleeve having four outer edges and a spine between two pockets, each pocket holding one of the circuit boards, the sleeve movable from a closed position wherein the insides of the circuit boards face each other to an open position wherein the outsides of the circuit boards face each other; and a diffuser having at least four outer edges and a plurality of foldlines, each of the outer edges of the diffuser connected to a respective outer edge of the sleeve; wherein, when the sleeve is in its closed position, the diffuser is between the circuit boards and is folded flat along its foldlines, and when the sleeve is in its open position, the diffuser surrounds the circuit boards and is unfolded along its foldlines.

BRIEF DESCRIPTION OF THE DRAWINGS

FIG. 6 is a diagram showing the diffuser of the lamp of FIG. 2A;

FIG. 7 is a diagram showing the start of assembly-folding the diffuser of FIG. 6;

FIG. 8 is a diagram showing an end-view of a diffuser that has been assembled but not yet connected to a gusset;

FIGS. 9A and 9B show gussets of the lamp of FIG. 2A;

FIGS. 14-16 are three-dimensional views of accessories used with the lamp of FIG. 2A.

DETAILED DESCRIPTION OF THE PRESENT INVENTION

The present invention is a portable lamp powered by a battery charged by solar panel or by wall-outlet power, and more particularly, is directed to a lamp that opens from (a) a flat book-like configuration with a collapsed light diffuser to (b) an open book-like configuration with a half-dome origami-like light diffuser to (c) a book opened so the outsides of the covers are back-to-back forming a 24-faced altered-cube-shape light diffuser. The spine of the "book" has ports for receiving wall outlet power and for charging an external device.

An advantage of the present lamp is that it can be easily shipped and stored in its flat configuration that occupies little space, particularly useful for shipping after a natural disaster, with other disaster relief supplies. Another advantage of the present lamp is that it can easily expand into a moderate size lighting device, cost-effectively replacing flashlights and kerosene lanterns. A further advantage of the present lamp is that it can be charged using either solar power or wall outlet power.

Yet another advantage of the present lamp is that, because it has a relatively large area available for solar charging, such charging can occur rapidly.

Families and individuals in tent cities are in desperate need of light at night to see things such as textbooks, and to improve safety, and also desperately need power to charge phones for communication. The World Bank estimates that families and individuals in developing countries that lack access to a functioning electrical grid spend an average of 30% of their disposable income on energy such as kerosene lamps, acid cell batteries, and diesel generators which are costly and inefficient. The present lamp enables reduction of spending on energy.

The present lamp can be used by campers and hikers for outdoor uses as a rechargeable, easy transportable lamp/light and energy source. The present lamp is waterproof and can be used in water activities. The present lamp can also be used as a household lamp and device charger, or as a pool, garden or landscape light.

The present lamp does not require a pump or mouth to inflate the diffuser, eliminating risk of the transmission of diseases such as Ebola, Cholera, *E coli,* and Zika.

Figure 1A:
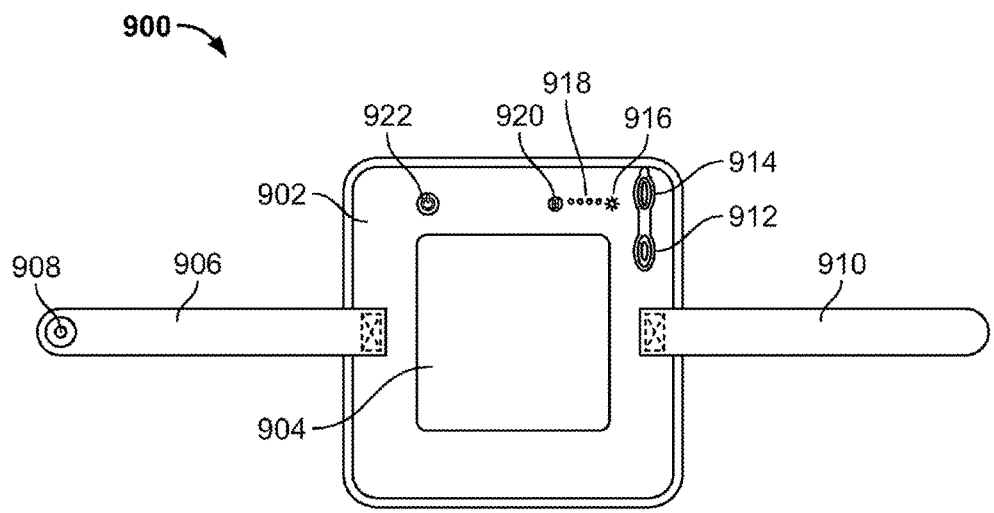
FIGS. 1A-1B show a prior art portable solar-powered lamp with device charger.
Figure 1B:
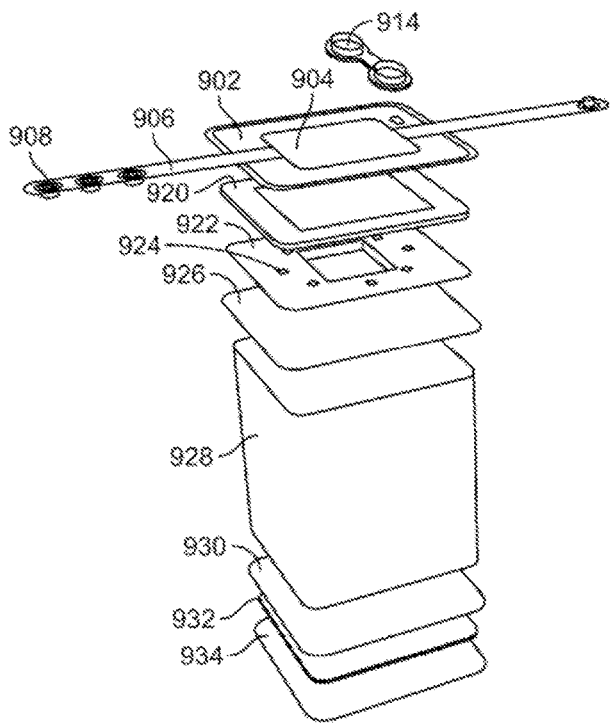
Figure 2A:
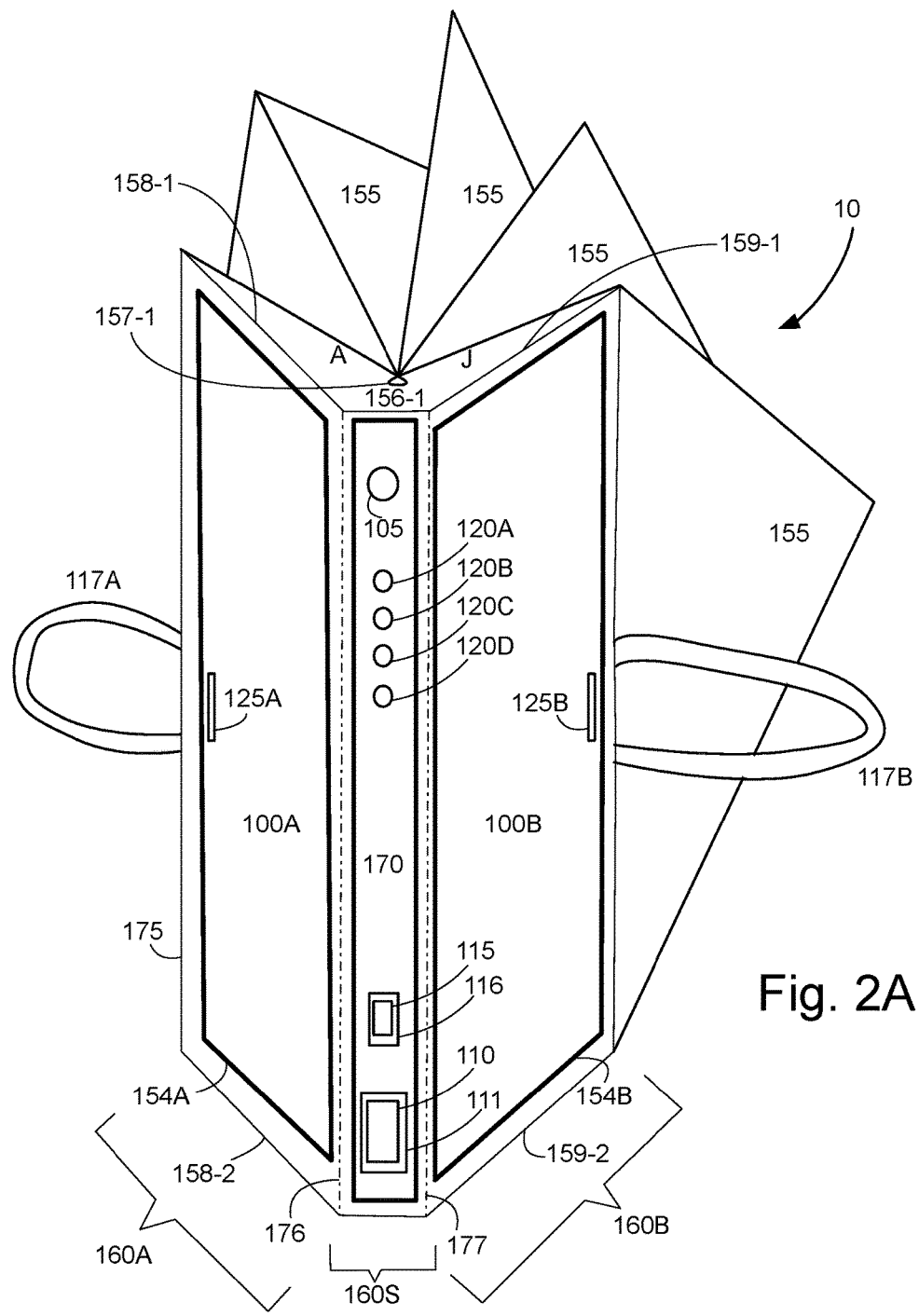
FIG. 2A is a three-dimensional view of a lamp with its covers open to form an angle of about 90°, seen from an observer looking sideways and down.
Figure 4:
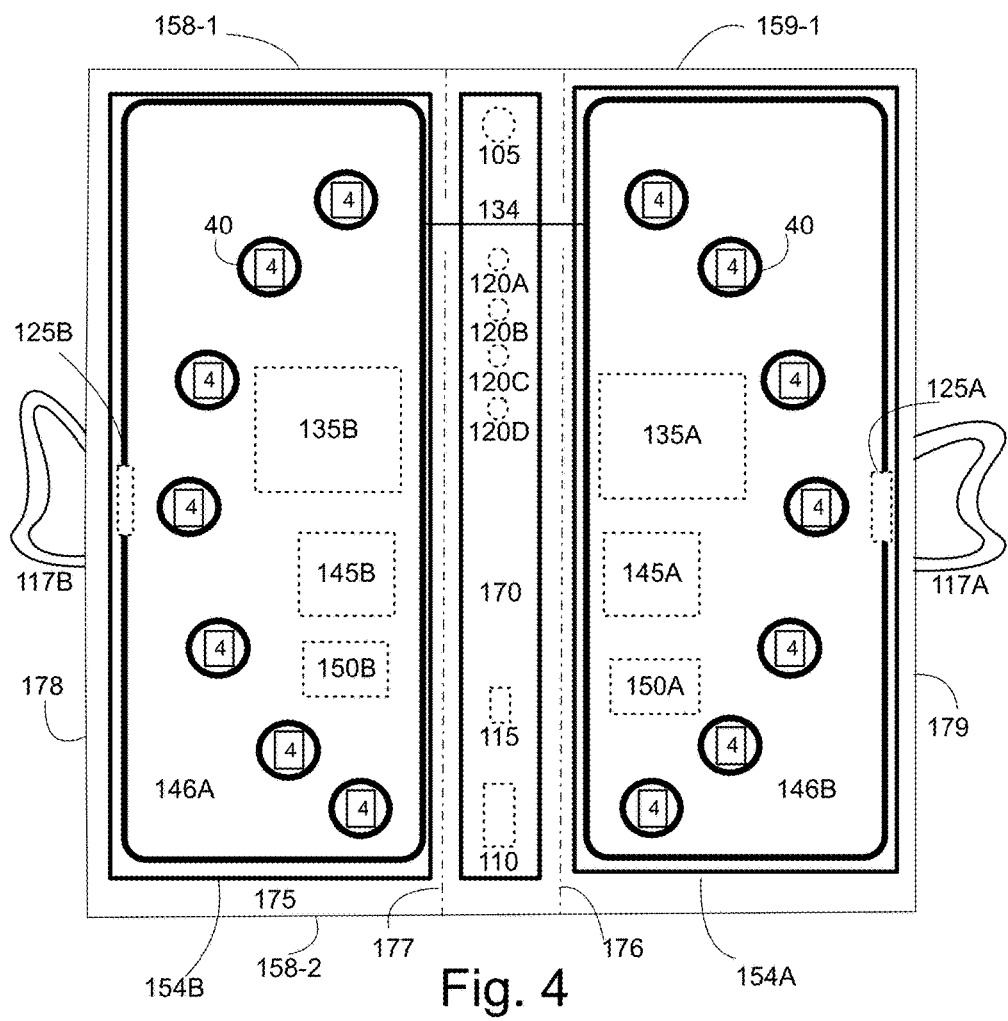
FIG. 4 is a view of the inside of the lamp covers when the covers are opened to form an angle of about 180°, and without the diffuser.

FIG. 2A is a three-dimensional view of lamp 10 with its covers 160A, 160B open to form an angle of about 90°, seen from an observer looking sideways and down. Lamp 10 has a sleeve sub-assembly, a diffuser subassembly, and handles. The outside of the sleeve subassembly is shown in FIG. 2A. The inside of the sleeve subassembly is shown in FIG. 4.

Figure 2B:
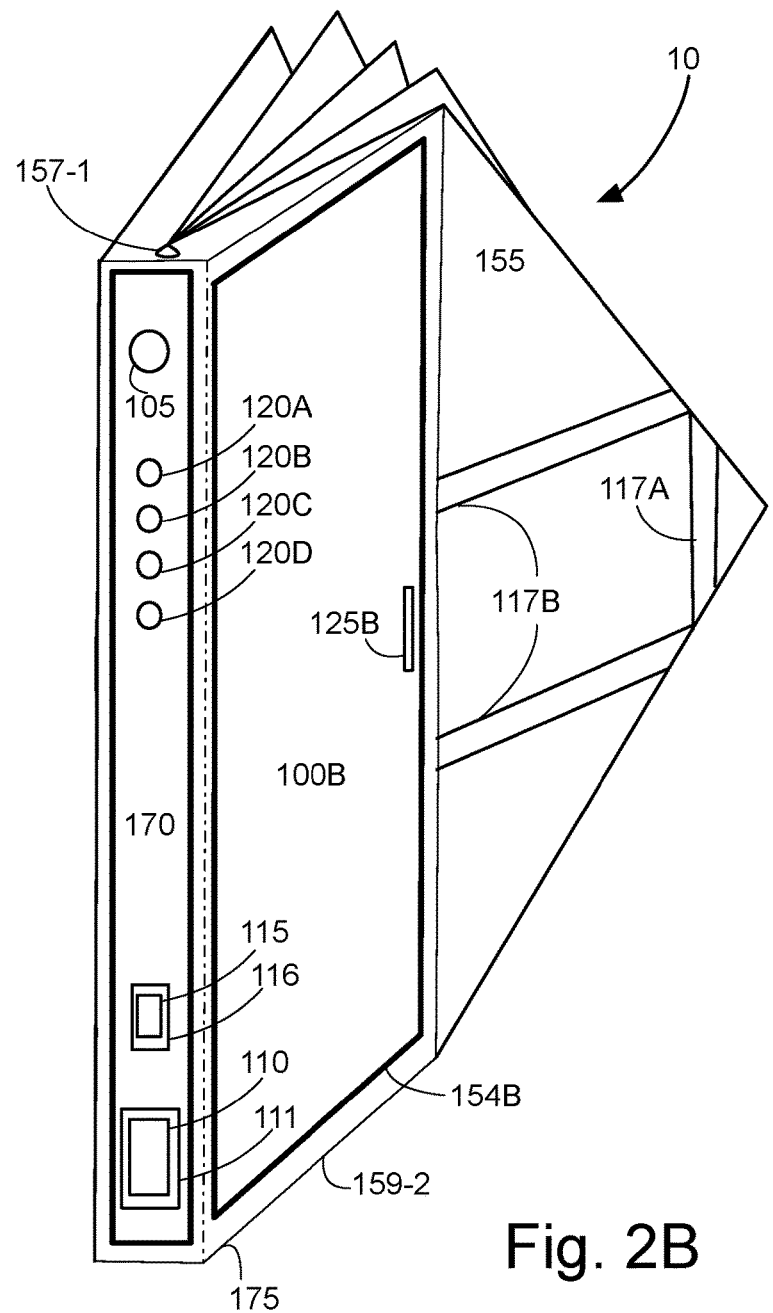
FIG. 2B is a three-dimensional view of a lamp with its covers closed, seen from an observer looking sideways and down.

FIG. 2B is a three-dimensional view of lamp 10 with its covers 160A, 160B closed.

The sleeve subassembly comprises printed circuit boards (PCBs) 154A, 154B and 170, and the components attached thereto, enclosed in sleeve 175.

The diffuser subassembly comprises diffuser 155 and gussets 156-1, 156-2.

FIGS. 3A-3D are side views of lamp 10, with the spine of lamp 10 perpendicular to the plane of the drawings page, showing the covers moved from closed to fully open. FIGS. 6-13 are diagrams referred to in explaining the operation of the diffuser subassembly.

Figure 5:
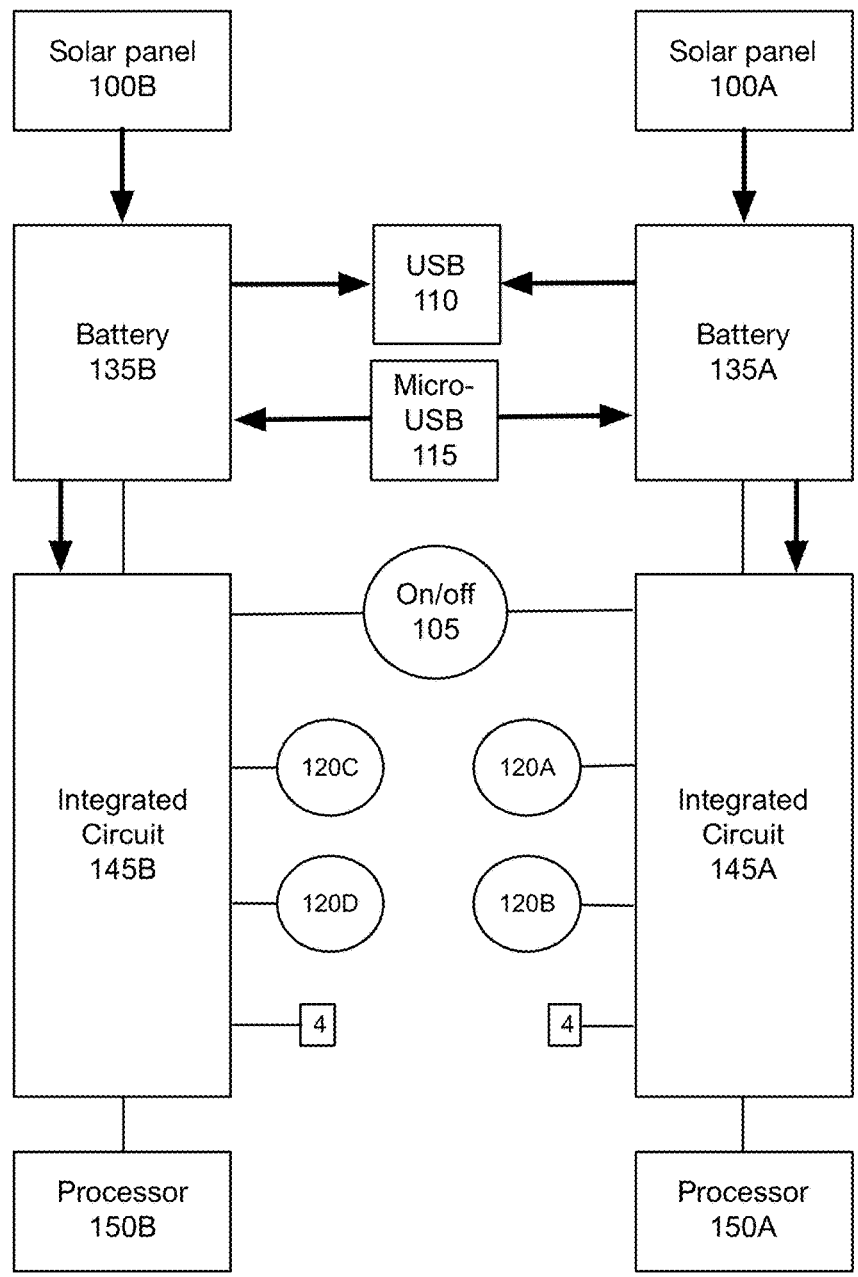
FIG. 5 is a circuit schematic showing how the components of the lamp are electrically connected.

FIG. 5 is a circuit schematic of lamp 10.

FIGS. 14-16 are accessories used with lamp 10.

PCB 170, enclosed in sleeve 175, forms spine 160S of lamp 10. PCB 170 has dimensions of about 7"×0.5" (180 mm×10 mm) and thickness of about 1/16" (3 mm).

PCBs 154A and 154B are mirror images of each other, and when enclosed in sleeve 175, serve as covers 160A, 160B of lamp 10. For brevity, only PCB 154A will be described. PCB 154A has dimensions of about 7"×3.5" (180 mm×90 mm) and thickness of about 1/16" (3 mm).

PCBs 154A, 154B and 170 are formed of an electrically non-conducting substrate, with sufficient rigidity to support the components thereon.

PCB 170 has the following elements mounted along its outside:

power on/off button 105 for controlling power to LEDs 4;
LED indicator lights 120A, 120B, 120C, 120D for indicating the percentage that batteries 135, shown in FIG. 4, are charged. Each of LEDs 120A-120D provides about 12-16 lumens of light with a life cycle of about 25,000-50,000 hours;
micro-USB port 115 for accepting wall-outlet power, with removable silicone plug 116;
USB port 110 for providing power to external devices, with removable silicone plug 111.

PCB 154A has photovoltaic panel 100A, also referred to as solar panel 100A, baked onto its outside (the side of PCB 154A that faces outward when lamp 10 is in its flat-pack closed configuration). In some embodiments, solar panel 100A comprises chip-like sections of photovoltaic material electrically connected to each other and to rechargeable battery 135A on the inside of PCB 154A. Solar panel 100A produces 5 watts of power and has a lifetime of about 10 years.

PCB 154A also has magnet 125A mounted on its outside. In some embodiments, magnet 125A is mounted on the inside of PCB 154A. Magnets 125A, 125B attract covers 160A, 160B of lamp 10 together when lamp 10 is in its fully closed or fully opened configurations, shown in FIGS. 3A and 3D. When lamp 10 is in its half-dome configuration shown in FIG. 3C, magnets 125A, 125B hold lamp 10 on a vertical metal surface such as a doorframe, or on horizontal bar 265 of chandelier fixture 250 shown in FIG. 15. When lamp 10 is in its filly opened configuration, magnets 125A, 125B hold lamp 10 on surface 230 of stand 220 shown in FIG. 13, or on surface 330 of stand 300 shown in FIG. 14.

On its inside (the side of PCB 154A that faces inward when lamp 10 is in its flat-pack closed configuration), PCB 154A has:

light emitting diodes (LEDs) 4, preferably 5-15 LEDs, arranged symmetrically, such as in a semi-circle, all LEDs 4 providing about 500 lumens of light with a life cycle of about 25,000-50,000 hours (there are 8,670 hours in one year). In one embodiment, all LEDs 4 provide white light, while in other embodiments, some or all LEDs 4 provide white light and colored light, possibly different colors;

rechargeable battery 135A that receives solar power from solar panel 100A and/or wall-outlet power from micro-USB port 115, that stores the received power, and that provides power, via integrated circuit 145A, to LEDs 4, indicators 120A-120D, USB port 110 and processor 150A. Preferably, battery 135A is capable of being charged and discharged at least 3,000-10,000 times. Battery 135A may be a lithium-ion rechargeable battery. Battery 135A desirably supplies at least 1,000-5,000 mAh while operating in an environmental temperature of −20° C. to 70° C., that is, enough to power a smart phone, or other electronic devices such as a wireless phone, wireless headphones, a tablet computer, or a laptop computer. Battery 135A desirably supplies enough power to operate LEDs 4 for 48 hours on a low setting and 12 hours on a high setting. Battery 135A fully charges after 8-10 hours of exposure to sunlight;

processor 150A that is a general purpose computer programmed to operate as discussed herein, in particular, to control LEDs 4 and indicators 120A-120B;

integrated circuit 145A including components such as resistors, capacitors and triodes (not shown) for enabling battery 135A and processor 145A to operate as described herein;

electrical connector 134 for carrying electrical signals between PCB 170 and PCB 154A via electrical conductor 134.

PCB 154A has reflector 146A on its inside surface, covering battery 135A, integrated circuit 145A and processor 150A. Reflectors 146A, 146B are formed of a reflective material, or have a thin reflective coating, and have concave surfaces 40 surrounding holes centered on LEDs 4. Concave surfaces 40 serve to increase the light reflected from the portions of reflectors 146A, 146B around LEDs 4.

Rectangular transparent sleeve 175 protects PCBs 154A, 154B and 170, and the components thereon, from water and dust. Sleeve 175 is formed of a transparent material such as ethylene vinyl acetate (EVA). Sleeve 175 is transparent to allow light to pass to photovoltaic cells on solar panels 100, so that solar panels 100 provide power to charge the batteries 135. Sleeve 175, when opened flat, has dimensions of about 7.5"×8.5" (190 mm×215 mm).

Sleeve 175 comprises an inside rectangular sheet and an outside rectangular sheet. After solar panels and components are mounted on PCBs 154A, 154B and 170, the PCBs are sandwiched between the inside and outside sheets of sleeve 175, and the perimeter of sleeve 175 is sealed so as to be waterproof, such as by heat sealing or sonic welding. Additionally, seams 176, 177 are formed by connecting the inside and outside sheets along thin lines parallel to the long edges of PCB 170, thereby creating pockets for PCBs 154A, 154B and 170, preventing movement of the PCBs. As shown in FIG. 4, where conductor 134 extends from PCB 170 to PCBs 154A, 154B, seams 176, 177 are interrupted to provide space for conductor 134.

For storage and shipping, sleeve 175 is folded along seams 176, 177, resulting in "book" dimensions of 7.5"×3.75"×1.0" (190 mm×95 mm×25 mm).

Sleeve 175 has two openings centered on the outside of PCB 170 and respectively covered by removable silicone plugs 116, 111. When removed, plugs 116, 111 respectively expose micro-USB port 115 and USB port 110, so that electrical connections can be formed via ports 115, 110.

FIG. 5 is a circuit schematic showing how the components of the lamp are electrically connected. Solar panel 110 and/or micro-USB port 115 provide power to batteries 135A, 135B. Batteries 135A, 135B store charge and, in turn, provides the stored charge to USB port 110 and integrated circuits 145A, 145B, and thence to processors 150A, 150B.

For brevity, only the operation of components on PCBs 154A and 170 will be described. The operation of components on PCBs 154B and 170 is similar.

Battery 135A also delivers a "charge remaining" sensor reading, also referred to as a battery status signal, to integrated circuit 145A that conveys the sensor reading to processor 150A.

On/off switch 105 controls whether and how LEDs 4 emit light. In some embodiments, on/off switch is actuated multiple times to cycle through an operating pattern, for instance: actuation 1—low light setting of about 45 lumens or 80 lumens, actuation 2—high light setting of about 500 lumens, actuation 3—blinking light setting, for emergency use, at about 500 lumens, actuation 4—no light but charging of an external device enabled. A low light setting is provided by either turning on only a subset of all LEDs 40, or by providing less power to LEDs capable of emitting different amounts of light. Another example of an operating pattern is: actuation 1—turn on four white LEDs and indicator 120, actuation 2—turn on all white LEDs and indicator 120, actuation 3—turn on only colored LEDs and indicator 120, actuation 4—turn off all LEDs but turn on indicator 120, actuation 5—turn off all LEDs and turn off indicator 120. In some embodiments, on/off button/switch is configured to prevent accidental turn-on, e.g., has enough mechanical resistance to being moved and/or is concave so as to minimize accidental actuation by an adjacent object.

Indicators 120A-120B are respectively turned on and off by processor 150A to indicate how much charge remains in battery 135A, based on the "charge remaining" sensor reading received by processor 150A from battery 135A. Indicators 120A-120B may be different colors, e.g., red for indicating very low charge, blue for indicating partial charge, green for indicating substantially full charge, and white for indicating charging is occurring from wall outlet power. In another embodiment, indicators 120A-120B blink while battery 135A is charging. In a further embodiment, when the charge remaining is 80-100%, all indicators 120A-120B are lit to provide bright light; when the charge remaining is 60-80%, indicators 120A-120B are lit to provide dim light; when the charge remaining is 40-60%, indicator 120A is lit to provide bright light while indicator 120B is unlit; and when the charge remaining is 20-40%, indicator 120A is lit to provide dim light while indicator 120B is unlit. In other embodiments, indicator lights 120A-120D are controlled according to different patterns.

Diffuser 155 and gussets 156-1, 156-2 are formed of a translucent material such as polyethylene terephthalate (PET), polylactic acid (PLA), ethylene vinyl acetate EVA) or thermoplastic polyurethane (TPU) that is recycled and has sufficient rigidity to hold shapes as described herein. Diffuser 155 is flexible, expandable and collapsible. Diffuser 155 diffuses light from LEDs 4, protecting eyes from possible harm from the intense light emitted by LEDs 4. Diffuser 155 begins as generally rectangular shape with sawtooth top and bottom edges having dimensions of about 15.5"×28" (400 mm×720 mm), see FIG. 6. Gussets 156-1, 156-2 are hexagons having four sides each of length about 4" (95 mm) and two sides of length about 1" (25 mm).

As shown in FIG. 6, diffuser is scored or otherwise treated to enable preferential folding along vertical lines 165 between the corresponding points-inward of sawtooth outer edges 162, 167, along vertical lines 166 between the corresponding points-outward of edges 162, 167, along horizontal lines 163, 147, and along diagonal lines defining triangular faces AA, BB, CC, DD, EE, FF, GG and HH. Dashed lines indicate folds that will be "valleys" while continuous interior lines indicate folds that will be "peaks". Edge 167 is shown in boldface for clarity in following how it is folded.

FIG. 7 is an angled top down view of diffuser 155 at the start of folding. The four vertices respectively shared by triangular faces AA and BB, CC and DD, EE and FF, and GG and HH are drawn together to become peaks, forcing valleys to form in the other faces of diffuser 155. FIG. 7 shows that faces AA-HH are eight peak faces, while the remaining top portion of diffuser 155 forms eight valley-scored parallelogram faces. Similarly, the remaining bottom portion of diffuser 155 (not shown) forms eight valley-scored parallelogram faces.

FIG. 8 shows a top down view of diffuser 155 when top edges B and C, D and E, F and G, H and I have been brought together and connected, such as by heat fusing, sonic welding or sewing. The four vertices shared by faces AA-HH are seen as points of four "star legs". When edges B-I are respectively connected, the eight valley-scored parallelogram faces of the top edge become eight valley-scored triangular faces. Similarly, when bottom edges L and M, N and O, P and Q, R and S have been connected, another eight valley-scored triangular faces are formed. The eight peak faces and sixteen valley-scored triangular faces form a 24-faced altered-cube-shape light diffuser when lamp 10 is in its fully extended configuration.

After top edges B-I of diffuser 155 have been respectively connected, top edge A of diffuser 155 is connected to edge A of gusset 156-1, shown in FIG. 9A, and top edge J of diffuser 155 is connected to edge J of gusset 156-1. Edge 157-1 of gusset 156-1 is left unconnected.

Similarly, after bottom edges L-S have been respectively connected, bottom edge K of diffuser 155 is connected to edge K of gusset 156-2, shown in FIG. 9B, and bottom edge T of diffuser 155 is connected to edge T of gusset 156-2. Edge 157-2 of gusset 156-2 is left unconnected. Thus connected, diffuser 155 and gussets 157-1, 157-2 form the diffuser subassembly.

Handles 117A, 117B are each formed of an elastic strip having dimensions of about 7.5"×0.5" (190 mm×12 mm). When covers 160A, 160B are closed, so that lamp 10 is in its flat pack configuration as shown in FIG. 2B, handles 117A, 117B are each looped around the triangular portion of diffuser 155 protruding from covers 1160A, 160B, to help keep the covers closed, along with force from magnets 125A, 125B. Alternatively, when covers 160A, 160B are fully closed or fully open, handles 117A, 117B can be left unlooped, and used to hang lamp 10 from a hook attached to a window by a suction cup (not shown) or a backpack (not shown).

The diffuser subassembly, handles and sleeve subassembly are connected as follows.

As shown in FIG. 4, the short edges of handle 117A are connected to edge 179 of sleeve 175, and the short edges of handle 117B are connected to edge 178 of sleeve 175, such as by heat fusing, sonic welding or sewing. Edge 161 of diffuser 155, shown in FIG. 6, is connected to edge 178 of sleeve 175, shown in FIG. 4, such as by heat fusing, sonic welding or sewing. Edge 162 of diffuser 155, shown in FIG. 6, is connected to edge 179 of sleeve 175, shown in FIG. 4, such as by heat fusing, sonic welding or sewing. Via similar connection technique, edges 158-1 and 159-1 of gusset 156-1, shown in FIG. 9A, are respectively connected to edges 158-1 and 159-1 of sleeve 175, shown in FIG. 4; and edges 158-2 and 159-2 of gusset 156-2, shown in FIG. 9B, are respectively connected to edges 158-2 and 159-2 of sleeve 175, shown in FIG. 4.

As shown in FIGS. 2A and 2B, unconnected edge 157-1 of gusset 156-1 forms a circular opening that allows air to flow into a bladder formed by the diffuser subassembly when covers 160A, 160B of lamp 10 are opened, and allows air to flow out of the bladder when covers 160A, 160B of lamp 10 are closed. Similarly (not shown), unconnected edge 157-2 of gusset 156-2 forms a circular opening that allows air to flow into a bladder formed by the diffuser subassembly when covers 160A, 160B of lamp 10 are opened, and allows air to flow out of the bladder when covers 160A, 160B of lamp 10 are closed.

Lamp 10 is waterproof because all electrical components are sealed inside sleeve 175. Lamp 10 in its fully extended configuration, as shown in FIG. 3D, readily floats on calm water; even if a little bit of water sloshes into the openings formed by edges 157-1, 157-2 of gussets 156-1, 156-2, the weight of the water is insufficient to sink lamp 10. However, if lamp 10 is in its fully extended configuration, and diffuser 155 is filled with water, lamp 10 will function as underwater lighting.

Figure 3A:
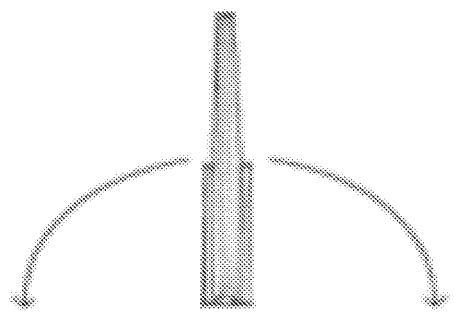
FIGS. 3A-3D are side views, with the spine of the lamp perpendicular to the plane of the page, showing the covers moved from closed to fully open.

FIG. 3A is an end-view showing covers 160A, 160B closed such that diffuser is 155 fully folded into s collapsed configuration between covers 160A, 160B, referred to as a "flat book" configuration suitable for storage and shipping. FIG. 2B is a corresponding three-dimensional view of the flat book configuration. In this position, magnets 125A, 125B attract the insides of covers 160A, 160B to each other, exposing solar panels 100A, 100B for charging by ambient light.

Figure 3B:
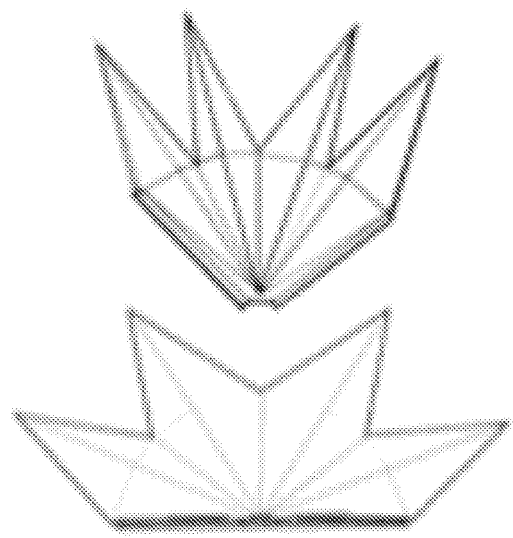

FIG. 3B shows covers 160A, 160B opened to form an angle of about 90°; FIG. 3B corresponds to the position of lamp 10 seen in FIG. 2A. In this position, lamp 10 has an origami-like fan configuration with the triangular fins of diffuser 155 forming a stand to better expose solar panels 100A, 100B to ambient light.

Figure 3C:
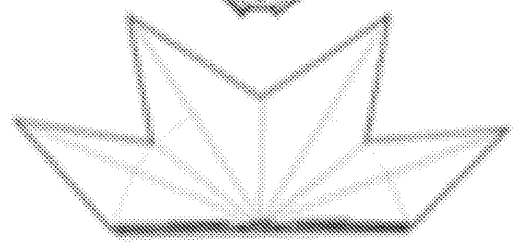
Figure 3D:
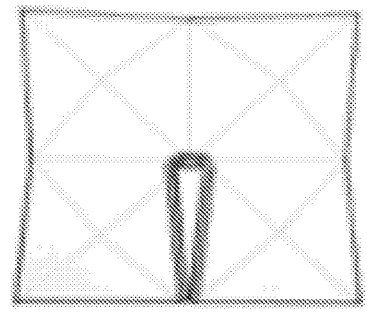

FIG. 3C shows covers 160A, 160B opened to form an angle of about 180°; diffuser 155 forms a generally haft-dome star-like shape with four triangular fins. In this position, magnets 125 can affix lamp 10 to a metal surface.

FIG. 3D shows covers 160A, 160B opened such that diffuser 155 fully opened into its largest volume, a 24-faced altered-cube-shape configuration, surrounding covers 160A, 160B. In this position, magnets 125 attract covers 160A, 160B to each other, so that light from LEDs 40 diffuses outward in this position, lamp 10 can charge from a wall outlet via a cable (not shown) connected to micro-USB port 115.

Because of the stiffness of the material of diffuser 155, and how it has been scored, diffuser 155 readily passes between the configurations depicted in FIGS. 3A-3D merely by opening and closing covers 160A, 160B; that is, there is no need for a user to touch diffuser 155 to put it into its proper shape.

The fully extended configuration of lamp 10 will now be described. Imagine a cube with six square faces: top, bottom, left, right, front, back. Replace the top, bottom, left, right square faces with diamonds. More specifically, as shown in FIG. 10, the middle-diamonds of FIG. 6 form three of the diamond-faces of the altered cube, while the edge diamonds AA and HH abut at their long edges to form the fourth diamond-face of the altered cube.

Now consider the top portion of diffuser 155, as shown in FIG. 8. When covers 160A, 160B are coupled by magnets 125A, 125B to fully extend diffuser 155, diffuser 155 moves from the shape shown in FIG. 8 to the shape shown in FIG. 11 (and FIG. 3D), with the spine of lamp 10 perpendicular to the page, referred to as a kinked-square. The bottom of the kinked-square is flattened because the cover edges meet there, whereas the other edges of the kinked-square are formed by the origami-like unfolded diffuser that retains its valleys (kinks). The central vertex projects from the page, so that the vertex is at the highest point. The fins of diffuser 155 are the outermost corners of the kinked-square. Each quadrant of the kinked-square has a valley formed by its connected triangles, so that top portion of diffuser 155 forms a snout projecting from the page and surrounded by four open pockets. Similarly, the bottom portion of diffuser 155 forms a snout surrounded by four open pockets.

Figure 10:
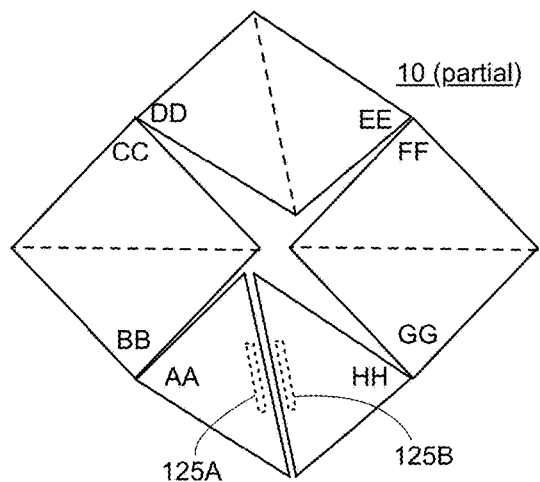
FIGS. 10-13 are diagrams referred to in explaining the fully expanded configuration of the lamp of FIG. 2A.
Figure 11:
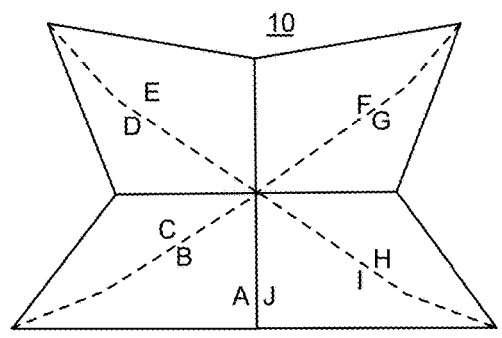
Figure 12:
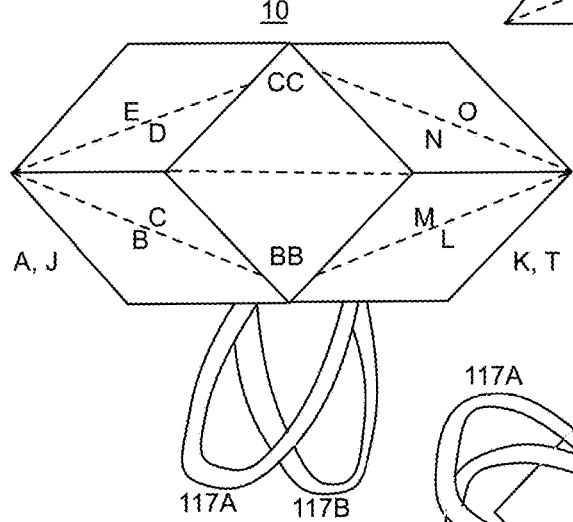

Return to the diamond-faced altered cube of FIG. 10. Now, instead of the square front and back faces of the cube, substitute the 4-pocketed snout, thus forming the 24-faced altered-cube-shape fully opened light diffuser of lamp 10. FIG. 12 shows a side view of lamp 10 in its fully opened configuration. The bottom of diffuser 155 is seen as a snout pointed to the right. The top of diffuser 155 is seen as a snout pointed to the left. A top pocket and a bottom pocket in the quadrants of the snouts are shown. Handles 117A, 117B project from the bottom surface. A similar view is presented when any of the diamond shaped faces shown in FIG. 10 is substituted for the diamond formed by faces BB and CC, i.e., when lamp 10 is rotated. In FIG. 12, the bottom edge has a length of about 7.5" (190 mm) and has a height about 7.5" (190 mm).

Figure 13:
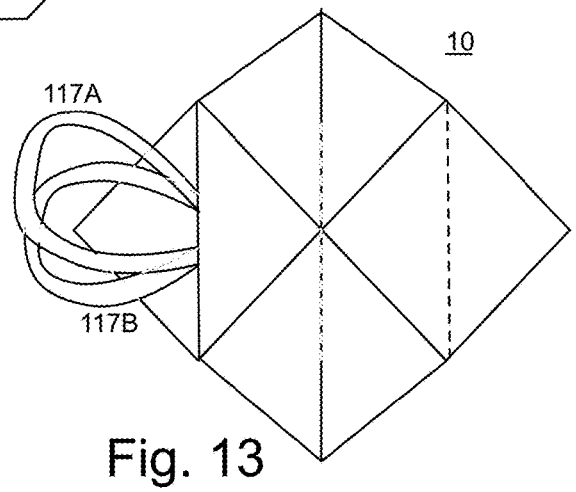

FIG. 13 shows another view of lamp 10, orthogonally rotated so that handles 117A, 117B are projecting to the left, the snouts are at the top and bottom, and the handle-bearing bottom surface is visible. Diffuser 155 presents a pleasing faceted shape, akin to a Christmas tree ornament, having a height of about 12" (305 mm).

FIGS. 14-16 are three-dimensional views of optional accessories used with lamp 10.

FIG. 14 shows stand 220 having base 210 with slot 205. The bottom of rectangular member 225 fits snugly into slot 205. Top portion 230 of member 225 has a metallic covering, so that magnets 125A, 125B of lamp 10 hold lamp 10 atop member 225, typically in the fully open configuration of FIG. 3D.

FIG. 15 shows stand 300 having base 310 with slot 305, also referred to as cavity 305. The bottom of member 320 fits inside slot 305. A first hinge (not shown) permits member 320 to rotate between a vertical and a horizontal position. The vertical position is for enabling member 320 to be a support. The horizontal position is for storage and shipping of stand 300. Member 320 has an elongated slot. The bottom of member 330 abuts the top of member 320. A second hinge (not shown) permits members 330 to rotate between a vertical and a horizontal position. The vertical position is for enabling member 330 to be a support. The horizontal position is for storage and shipping of stand 300. Top portion 325 of member 330 has a metallic covering, so that magnets 125A, 125B of lamp 10 hold lamp 10 atop member 330. In a variation, instead of hinges, member 330 can be located concentrically inside member 320, and telescope upwards to support lamp 10.

FIG. 16 shows chandelier 250 having ceiling attachment 255, vertical member 260 projecting downwards from ceiling attachment 255, and horizontal member 265 attached to the bottom of vertical member 260. Ceiling attachment 255 is connected to the ceiling of a room (not shown) via any convenient technique such as a screw, double-sided tape, or magnets (some home have tin roofs). The bottom of horizontal member 265 has a metallic covering, so that magnets 125A, 125B of lamp 10 hold lamp 10 to member 265, typically in the open book configuration of FIG. 3C. If the ceiling (not shown) has a skylight, then lamp 10 can charge during the day while it hangs, and provide light at night, being removed from horizontal member 265 only to turn it on each evening by depressing on/off button 105.

Operation of lamp 10 will now be discussed.

Assume lamp 10 begins in its flat-pack configuration, as shown in FIG. 3A, with magnets 125A, 125B attracting covers 160A, 160B together.

Pulling covers 160A, 160B apart, so that covers 160A, 160B approximately form a right angle, moves lamp 10 into the configuration of FIG. 3B, wherein solar panels 100A, 100B can be simultaneously exposed to ambient light, as shown in FIG. 2A. Solar panels 100A, 100B convert ambient light to electrical charge and transfer the charge to batteries 135A, 135B that store the charge.

Further pulling covers 160A, 160B apart, so that covers 160A, 160B approximately lie next to each other in an "open book" configuration, places diffuser 155 into its half-dome configuration of FIG. 3C, also enabling solar panels 100A, 100B to be simultaneously exposed to ambient light.

Continuing to pull covers 160A, 160B results in pushing their outsides together, with magnets 125A, 125B keeping them adjacent, as in the configuration of FIG. 3D, wherein diffuser 155 is fully expanded into a cube-like shape. Solar panels 100A, 100B are mostly hidden from ambient light, so this configuration is inappropriate for charging. However, light from LEDs 40 is maximally dispersed in this configuration, appropriate for general-purpose lighting.

To return lamp 10 from its fully-opened cube-like shape to its initial flat pack book-like shape, covers 160A, 160B are simply pulled apart and then pushed together so that their insides face each other.

After battery 135A, 135B has at least some charge from solar panels 100A, 100B or micro-USB port 115, an external device (not shown) can be connected to USB port 110, so that the charge stored in battery 135A 135B provides power to the external device.

After battery 135A, 135B has at least some charge from solar panels 100A, 100B or micro-USB port 115, depressing on/off button 105 causes processors 150A, 150B to control indicators 120A-120D to indicate the amount of charge in batteries 135A, 135B, and to illuminate LEDs 40 in a first pattern, such as a low light pattern. Depressing button 105 a second time causes processor 145 to illuminate LEDs 40 in a second pattern, such as a high light pattern. Depressing button 105 a third time causes processor 145 to illuminate LEDs 40 in a third pattern, such as a blinking light pattern. Depressing button 105 a fourth time causes processor 145 to turn off indicators 120A-120D and return lamp 10 to its passive state wherein solar panels 100A, 100B can convert ambient light to charge for storing power in battery 135A, 135B, but no other components are active.

When charge in batteries 135A, 135B is depleted, lamp 10 automatically returns to its passive state, as if button 105 had been depressed a fourth time.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A portable lamp, comprising:
   two circuit boards, each circuit board having an outside and an inside, each outside having at least one solar panel, each inside having (a) at least two light emitting diodes (LEDs), (b) a rechargeable battery, and (c) a circuit connecting the solar panel, the battery, and the LEDs;
   a transparent sleeve having four outer edges and a spine between two pockets, each pocket holding one of the circuit boards, the sleeve movable from a closed position wherein the insides of the circuit boards face each other to an open position wherein the outsides of the circuit boards face each other; and
   a diffuser having at least four outer edges and a plurality of foldlines, each of the outer edges of the diffuser connected to a respective outer edge of the sleeve;
   wherein, when the sleeve is in its closed position, the diffuser is between the circuit boards and is folded flat along its foldlines, and when the sleeve is in its open position, the diffuser surrounds the circuit boards and is unfolded along its foldlines.

2. The portable lamp of claim 1, further comprising a port connected to at least one of the rechargeable batteries, for providing power to an external device.

3. The portable lamp of claim 1, further comprising a port connected to at least one of the rechargeable batteries, for accepting power from an external device.

4. The portable lamp of claim 1, further comprising a third circuit board having an on/off button connected to the circuits on the two circuit boards, and wherein the spine of the sleeve has a third pocket holding the third circuit board.

5. The portable lamp of claim 4, further comprising at least one battery status indicator mounted on the third circuit board and connected to at least one of the circuits on the two circuit boards, and wherein at least one of the rechargeable batteries provides a battery status signal to the circuit to which it is connected so that the battery status indicator is responsive to the battery status signal.

6. The portable lamp of claim 4, further comprising a USB port and a micro-USB port mounted on the third circuit board and connected to at least one of the rechargeable batteries on the two circuit boards, respectively for providing power to an external device and for accepting power from an external device.

7. The portable lamp of claim 1, further comprising two handles, each handle attached to one of the outer edges of the sleeve.

8. The portable lamp of claim 1, further comprising a magnet mounted on each of the two circuit boards, the magnets for attracting the circuit boards when the sleeve is in its open position or its closed position.

9. The portable lamp of claim 1, wherein the diffuser has 24 sides.

10. The portable lamp of claim 1, wherein the diffuser comprises a generally rectangular piece with a plurality of foldlines and a plurality of edges, and two gussets connected to the rectangular piece along some of the edges of the rectangular piece.

11. The portable lamp of claim 1, further comprising a stand having a portable base and a removable upright member for supporting the lamp.

12. The portable lamp of claim 1, further comprising a stand having a portable base and a member that folds between a vertical position for supporting the lamp, and a horizontal position for storage.

13. A lighting device comprising a portable lamp and a chandelier;

the portable lamp comprising
  two circuit boards, each circuit board having an outside and an inside, each outside having at least one solar panel, each inside having (a) at least two light emitting diodes (LEDs), (b) a rechargeable battery, and (c) a circuit connecting the solar panel, the battery, and the LEDs;
  a transparent sleeve having four outer edges and a spine between two pockets, each pocket holding one of the circuit boards, the sleeve movable from a closed position wherein the insides of the circuit boards face each other to an open position wherein the outsides of the circuit boards face each other; and
  a diffuser having at least four outer edges and a plurality of foldlines, each of the outer edges of the diffuser connected to a respective outer edge of the sleeve;
  wherein, when the sleeve is in its closed position, the diffuser is between the circuit boards and is folded flat along its foldlines, and when the sleeve is in its open position, the diffuser surrounds the circuit boards and is unfolded along its foldlines; and
the chandelier comprising:
  a ceiling attachment for attaching to a ceiling of a room;
  a horizontal member for supporting the portable lamp; and
  a vertical member having two ends, one end connected to the ceiling attachment and the other end connected to the horizontal member.

* * * * *